US007592273B2

(12) United States Patent
Filipiak et al.

(10) Patent No.: US 7,592,273 B2
(45) Date of Patent: Sep. 22, 2009

(54) SEMICONDUCTOR DEVICE WITH HYDROGEN BARRIER AND METHOD THEREFOR

(75) Inventors: Stanley M. Filipiak, Pflugerville, TX (US); Zhi-Xiong Jiang, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 148 days.

(21) Appl. No.: 11/737,499

(22) Filed: Apr. 19, 2007

(65) Prior Publication Data

US 2008/0261407 A1 Oct. 23, 2008

(51) Int. Cl.
*H01L 21/31* (2006.01)
*H01L 21/469* (2006.01)

(52) U.S. Cl. ....................... 438/793; 438/783; 438/792; 257/E21.267; 257/E21.477; 427/255.393

(58) Field of Classification Search ................ 438/783, 438/784, 793, 794, 792, 789; 257/E21.477, 257/E21.269, E21.267; 427/255.23, 255.393, 427/255.394
See application file for complete search history.

(56) References Cited

U.S. PATENT DOCUMENTS 6,746,545 B2 6/2004 Tamura et al.
6,750,492 B2 6/2004 Mikawa et al.
6,756,262 B1 6/2004 Nakamura et al.
6,756,282 B2 6/2004 Nagano et al.
6,762,446 B2 7/2004 Amiotti et al.
6,767,750 B2 7/2004 Summerfelt et al.
6,770,492 B2 8/2004 Waki et al.
6,773,930 B2 8/2004 Summerfelt et al.
6,781,177 B2 8/2004 Kutsunai
6,781,184 B2 8/2004 Solayappan et al.
6,794,199 B2 9/2004 Yoshikawa et al.
6,803,634 B2 10/2004 Okuno et al.
6,815,223 B2 11/2004 Celinska et al.
6,828,161 B2 12/2004 Summerfelt et al.
6,849,894 B2 2/2005 Lin et al.
6,849,959 B2 2/2005 Inomata
6,867,446 B2 3/2005 Otani et al.
6,876,021 B2 4/2005 Martin et al.
6,890,769 B2 5/2005 Cross
6,891,715 B2 5/2005 Mikawa et al.
6,897,503 B2 5/2005 Otani et al.
6,900,095 B2 5/2005 Yoon
6,902,487 B2 6/2005 Welschof
6,902,939 B2 6/2005 Moise et al.
6,906,908 B1 6/2005 Yabuki et al.

(Continued)

*Primary Examiner*—Caridad M Everhart
(74) *Attorney, Agent, or Firm*—James L. Clingan, Jr.; Michael J. Balconi-Lamica

(57) ABSTRACT

A method of forming a semiconductor device comprises providing a portion of a semiconductor device structure, wherein the portion includes a region susceptible to hydrogen incorporation due to subsequent device processing. For example, the subsequent device processing can include one or more of (i) forming a layer over the region, wherein the layer includes hydrogen and (ii) using gases containing hydrogen in a plasma for the subsequent device processing, wherein the semiconductor device is subject to an undesirable device characteristic alteration by hydrogen incorporation into the region. The method further comprises forming a hydrogen barrier layer overlying the region, wherein the hydrogen barrier layer prevents substantial migration of hydrogen made available due to the subsequent device processing into the underlying region. The method further includes performing the subsequent device processing.

16 Claims, 4 Drawing Sheets

U.S. PATENT DOCUMENTS

| | | | | |
|---|---|---|---|---|
| 6,908,772 | B2 | 6/2005 | Gnadinger | |
| 6,911,362 | B2 | 6/2005 | Kim et al. | |
| 6,917,062 | B2 | 7/2005 | Natori | |
| 6,930,340 | B2 | 8/2005 | Hasegawa et al. | |
| 6,943,398 | B2 | 9/2005 | Ito et al. | |
| 6,956,729 | B2 | 10/2005 | Fujii et al. | |
| 6,958,508 | B2 | 10/2005 | Mikawa | |
| 6,965,141 | B2 | 11/2005 | Mikawa | |
| 6,967,368 | B2 | 11/2005 | Ozaki et al. | |
| 6,972,449 | B2 | 12/2005 | Yoshikawa et al. | |
| 6,972,990 | B2 | 12/2005 | Kumura et al. | |
| 6,982,444 | B2 | 1/2006 | Kanaya et al. | |
| 6,982,448 | B2 | 1/2006 | Udayakumar et al. | |
| 6,982,453 | B2 | 1/2006 | Kanaya et al. | |
| 6,984,857 | B2 | 1/2006 | Udayakumar et al. | |
| 6,984,861 | B2 | 1/2006 | Yamada et al. | |
| 6,995,417 | B2 | 2/2006 | Yamazaki et al. | |
| 6,998,275 | B2 | 2/2006 | Zhao et al. | |
| 7,001,778 | B2 | 2/2006 | Karasawa et al. | |
| 7,001,821 | B2 | 2/2006 | Aggarwal et al. | |
| 7,019,352 | B2 | 3/2006 | Udayakumar et al. | |
| 7,026,169 | B2 | 4/2006 | Kijima et al. | |
| 7,029,925 | B2 | 4/2006 | Celii et al. | |
| 7,030,435 | B2 | 4/2006 | Gnadinger | |
| 7,037,731 | B2 * | 5/2006 | Kijima et al. | 438/3 |

* cited by examiner

SEMICONDUCTOR DEVICE WITH HYDROGEN BARRIER AND METHOD THEREFOR

BACKGROUND

1. Field

This disclosure relates generally to semiconductors, and more specifically, to semiconductor devices with barriers to unwanted penetration by a material.

2. Related Art

In the development of integrated circuits, one of the problems that has been increasing as dimensions have continually gotten smaller is hydrogen migration, especially when the hydrogen penetrates into transistor channel regions. Hydrogen incorporation in the channel alters the electrical characteristics of the transistors and can reduce reliability. Not only can it degrade performance, but it also introduces another variable so that transistor performance is less predictable. The techniques for addressing this have generally centered around reducing the generation of hydrogen and altering implants. Reducing hydrogen generation is difficult because many depositions and etches involve plasma that contains hydrogen. For most situations, a dry etch is desirable and requires the use of plasma that contains hydrogen. Similarly, most depositions are preferably by plasma and require plasma that contains hydrogen.

Thus there is a need for reducing the problems associated with hydrogen in a semiconductor process.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device has a semiconductor layer with an overlying barrier layer comprising silicon, carbon, and nitrogen. This barrier layer has been found to be effective as a barrier against hydrogen penetration even in the presence of a plasma that contains hydrogen. The barrier is preferably formed before the interlayer dielectric layers (ILDs) and optional stressor layers are formed. Thus the hydrogen that is used during those processes is blocked by the barrier layer to retard hydrogen migration into the channel. This is better understood by reference to the following description and the drawings.

The semiconductor substrate described herein can be any semiconductor material or combinations of materials, such as gallium arsenide, silicon germanium, semiconductor-on-insulator (SOI) or bulk silicon, monocrystalline silicon, the like, and combinations of the above.

Figure 1:
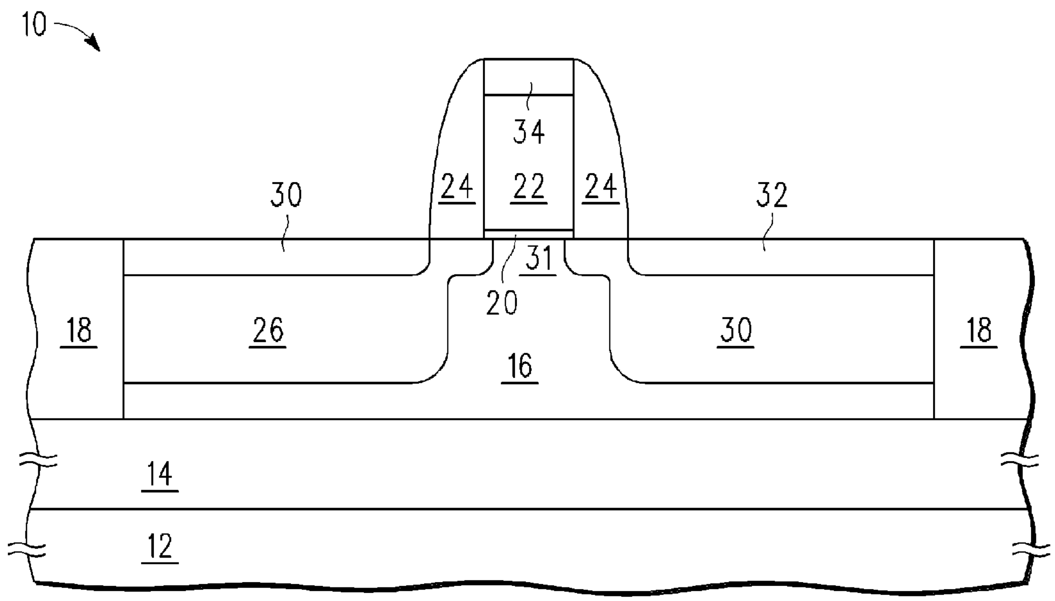
FIG. 1 is a cross section of a semiconductor device at a stage in processing according to one embodiment.

Shown in FIG. 1 is a semiconductor device 10, which includes a MOS transistor in this example, comprising a semiconductor supporting substrate 12, an insulating layer 14 on substrate 12, and a semiconductor layer 16 on an optional insulating layer 14, a gate dielectric 20 over semiconductor layer 16, a gate electrode 22 over gate dielectric 20, a source/drain 26 in semiconductor layer 16 and substantially aligned to one side of gate 22, a source/drain 28 in semiconductor layer 16 and substantially aligned to an opposite side of gate 22, a sidewall spacer 24 surrounding gate 22, an isolation region 18 extending through semiconductor layer 16 to insulating layer 14 and surrounding source/drain regions 26 and 28, a silicide region 30 on source/drain region 26, a silicide region 32 on source/drain region 28, and a silicide region on gate electrode 22. A channel 31 is in semiconductor layer 16 in the region between source/drain regions 26 and 30 immediately under gate dielectric 20. In this example, semiconductor supporting substrate 12 comprises silicon, insulating layer 14 comprises oxide, semiconductor layer 16 comprises silicon, isolation region 18 comprises oxide, spacer 24 comprises a composite of an oxide liner and a nitride spacer, gate electrode 22 comprises polysilicon, and silicide regions 30, 32, and 34 comprise nickel silicide. These materials may vary. For example, gate electrodes 22 and 34 may comprise a combination of layers in which one or more of the layers may be metal. The thickness of gate electrode 22 including silicide layer 34 may be about 1000 Angstroms. The width of sidewall spacers 24 may be about half the height of gate electrode 22. Silicide layers 30, 32, and 34 may be about 200 Angstroms thick. The dimensions are exemplary and could vary significantly. Gate dielectric 20 may be about 20 Angstroms for the case of an oxide dielectric. This dimension could vary significantly, especially if another material is used.

Figure 2:
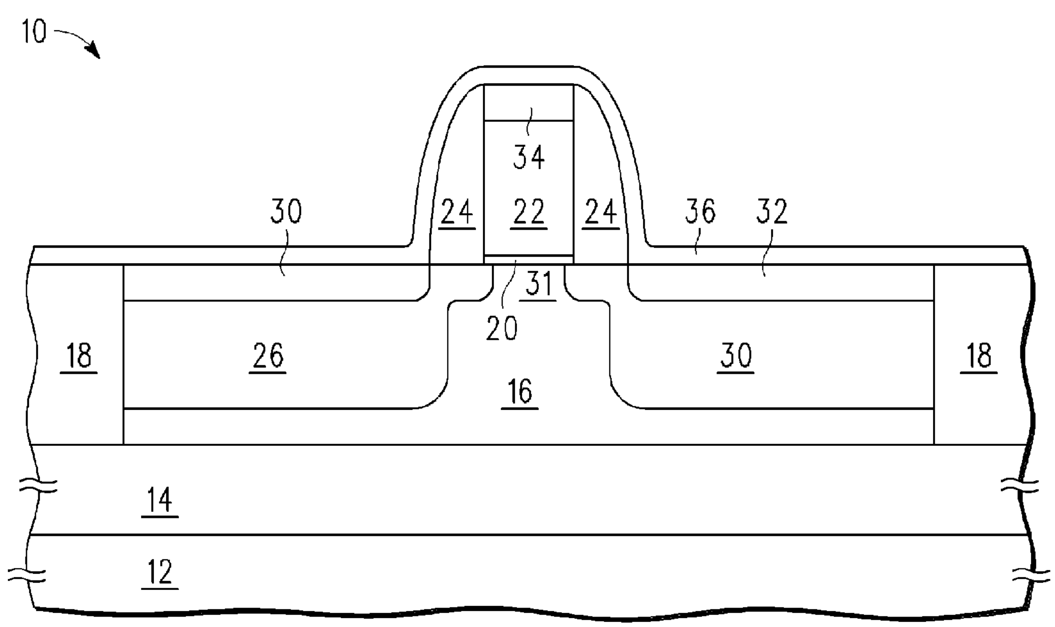
FIG. 2 is a cross section of the semiconductor device of FIG. 1 at a subsequent stage in processing.

Shown in FIG. 2 is semiconductor device 10 after forming a barrier layer 36 over semiconductor layer 16 which in this case has the affect of being over silicide regions 30 and 32, sidewall spacer 24, and gate electrode 22 as well as over isolation region 18. One effective way of forming barrier layer is a plasma enhanced chemical vapor deposition (PECVD) using trimethylsilane (TMS), helium, and ammonia. One set of conditions that have been found to be effective are 3.0 Torr, 300 watts, 350 degrees Celsius, helium at 400 standard cubic centimeters per minute (SCCMs), TMS at 160 SCCMs, and ammonia at 325 SCCMs. Barrier layer 36 is preferably relatively thin. It needs to be thick enough to prevent hydrogen penetration but sufficiently thin to have minimal impact on the affect of subsequent layers. It is believed that the primary concern for ensuring that barrier layer 36 is an effective barrier to hydrogen penetration is that it be continuous. A thickness of 150 Angstroms has been found to be effective as hydrogen barrier. This 150 Angstrom barrier formed in the described manner has shown to provide at least ninety percent blockage of hydrogen penetration as compared to hydrogen penetration without the barrier. A thinner continuous film may be achievable that would be an effective as a hydrogen barrier. Another deposition technique such as atomic layer deposition (ALD) may be able to provide a continuous film at a reduced thickness. Barrier layer 36 deposited using the described PECVD process results in barrier layer 36 comprising silicon, carbon, nitrogen, and hydrogen. Removing the carbon has been found to result in the barrier being less effective. The presence of hydrogen is a byproduct of the process used and may not be necessary. The ALD process may allow for significantly reducing the hydrogen content in the resulting barrier layer.

Figure 3:
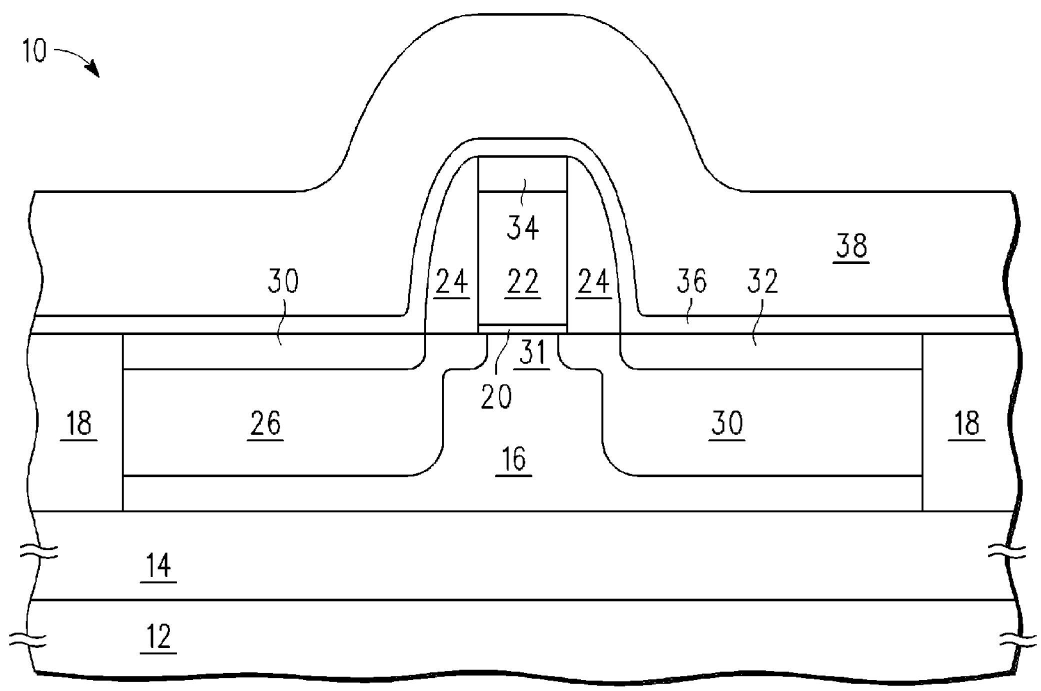
FIG. 3 is a cross section of the semiconductor device of FIG. 2 at a subsequent stage in processing.

Shown in FIG. 3 is semiconductor device 10 after depositing a stressor layer 38 over barrier 36 and thus over gate electrode 22 and source/drains 26 and 28. Stressor layer 38, in this example, is nitride deposited with tensile for an N channel transistor or compressive stress for a P channel transistor. Stressor layer 38 in this example is about 800 Angstroms but could vary significantly from that and is deposited using PECVD. This type of deposition, which typically includes the use of plasma that contains hydrogen, results in the generation of energetic hydrogen molecules and/or atoms that can penetrate typical oxide and nitride films. Also the result is that stressor layer contains free hydrogen. This hydrogen is capable of migrating to channel region 31. Barrier layer 38 is for preventing that type of hydrogen migration penetrating into channel 31. Barrier layer 36, being relatively thin and having little or no stress, has minimal adverse impact on the desired affect of stressor 38 on channel 31 under gate 22 in semiconductor layer 16. Stressor layer 38 is optional but stressors of this type are being commonly considered for use because of the enhancement in carrier mobility they induce. Further, stressor layers may be patterned to have different stressor layers for the P and N channel transistors.

Figure 4:
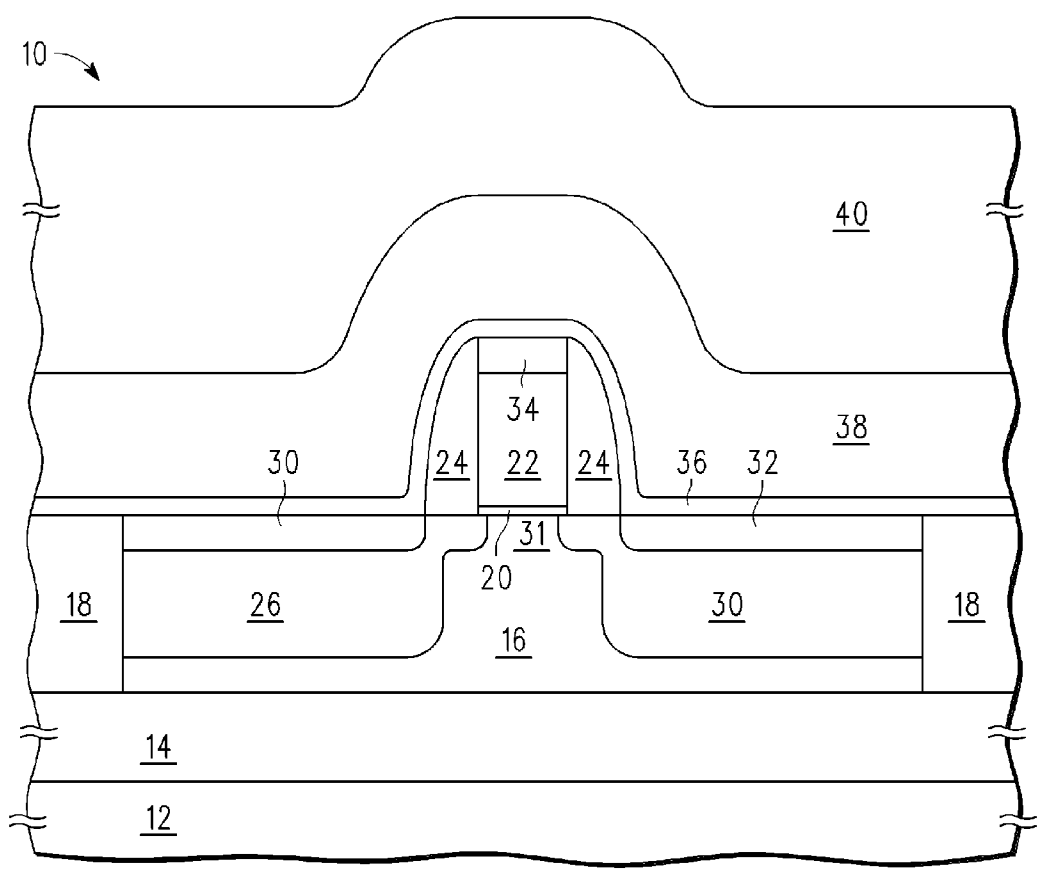
FIG. 4 is a cross section of the semiconductor device of FIG. 3 at a subsequent stage in processing.

Shown in FIG. 4 is semiconductor device 10 after depositing an interlayer dielectric layer (ILD) 40 over stressor layer 38. ILD 40 may be oxide deposited by PECVD. In such case hydrogen is typically present and active due to the plasma and can easily find its way to channel 31 region except that barrier layer 36 is for preventing that type of penetration. ILD 40 is preferably greater than about 6000 Angstroms which is a common dimension for an ILD layer over a gate. This can vary greatly though.

Figure 5:
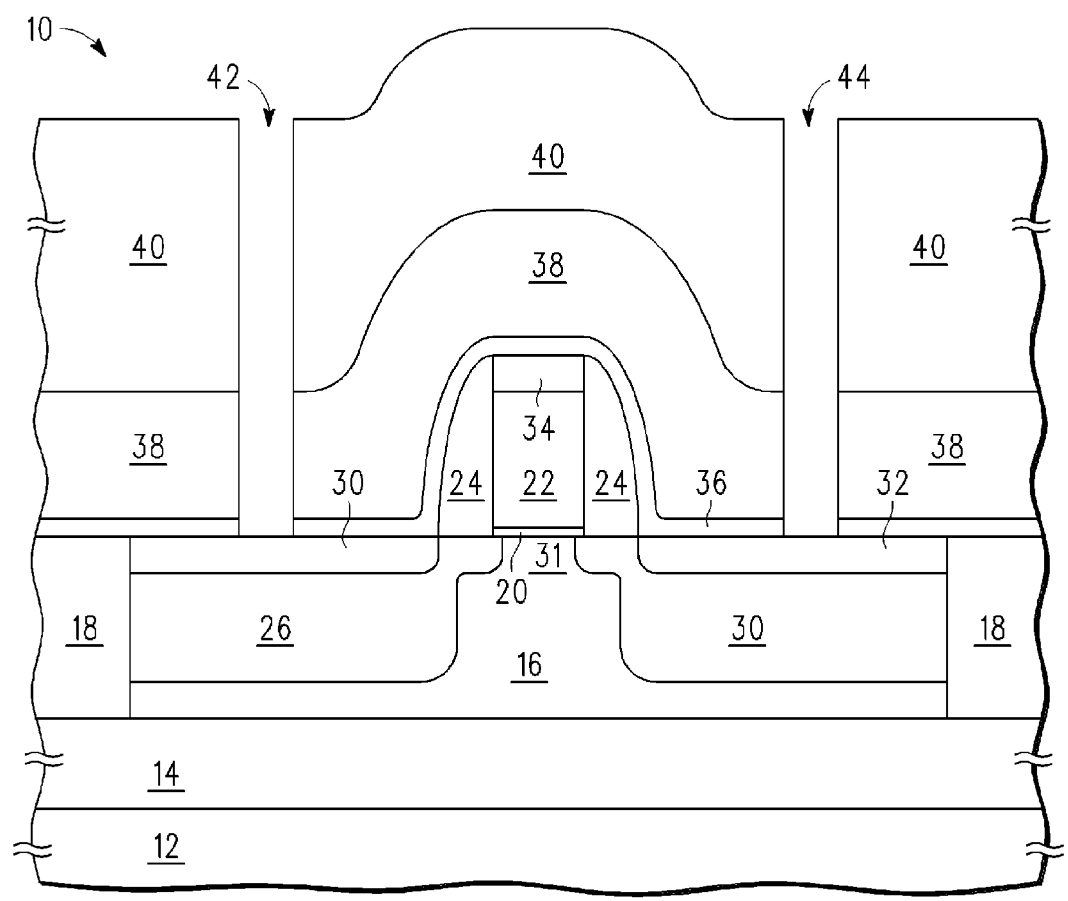
FIG. 5 is a cross section of the semiconductor device of FIG. 4 at a subsequent stage in processing.

Shown in FIG. 5 is semiconductor device 10 after forming an opening 42 through ILD 40, stressor layer 38, and barrier layer 36 over silicide region 30 and forming an opening 44 through ILD 40, stressor layer 38, and barrier layer 36 over silicide region 32. Openings 42 and 44, which may also be called vias or via holes, are formed typically using a plasma process using hydrogen so that mobile hydrogen is present. As for the formation of the stressor layer 38 and ILD 40, this step can result in hydrogen reaching channel 31. Barrier layer 36 is for acting as a barrier to this type of hydrogen penetration. To expose silicide regions 30 and 32, barrier layer 36 is opened. This can result in plasma that contains hydrogen being present when barrier layer 36 is being opened. This should be for a short time, but to further reduce plasma that contains hydrogen exposure to the opening in barrier layer 36, the etch chemistry can be changed when barrier layer 36 is reached to avoid mobile hydrogen generation. Barrier layer 36 can in fact act as an etch stop. Upon reaching barrier layer 36, the etch chemistry can be switched to an etchant that is a hydrogen-plasma-free etchant. One such etchant is oxygen plasma followed by hydrofluoric acid (HF). The HF can be either liquid or gas. Although hydrogen is present in the HF, it is not excited into an atomic or free radical state because it is not in a plasma and is thus not of the kind that has nearly the penetrating affect of hydrogen in plasma.

Figure 6:
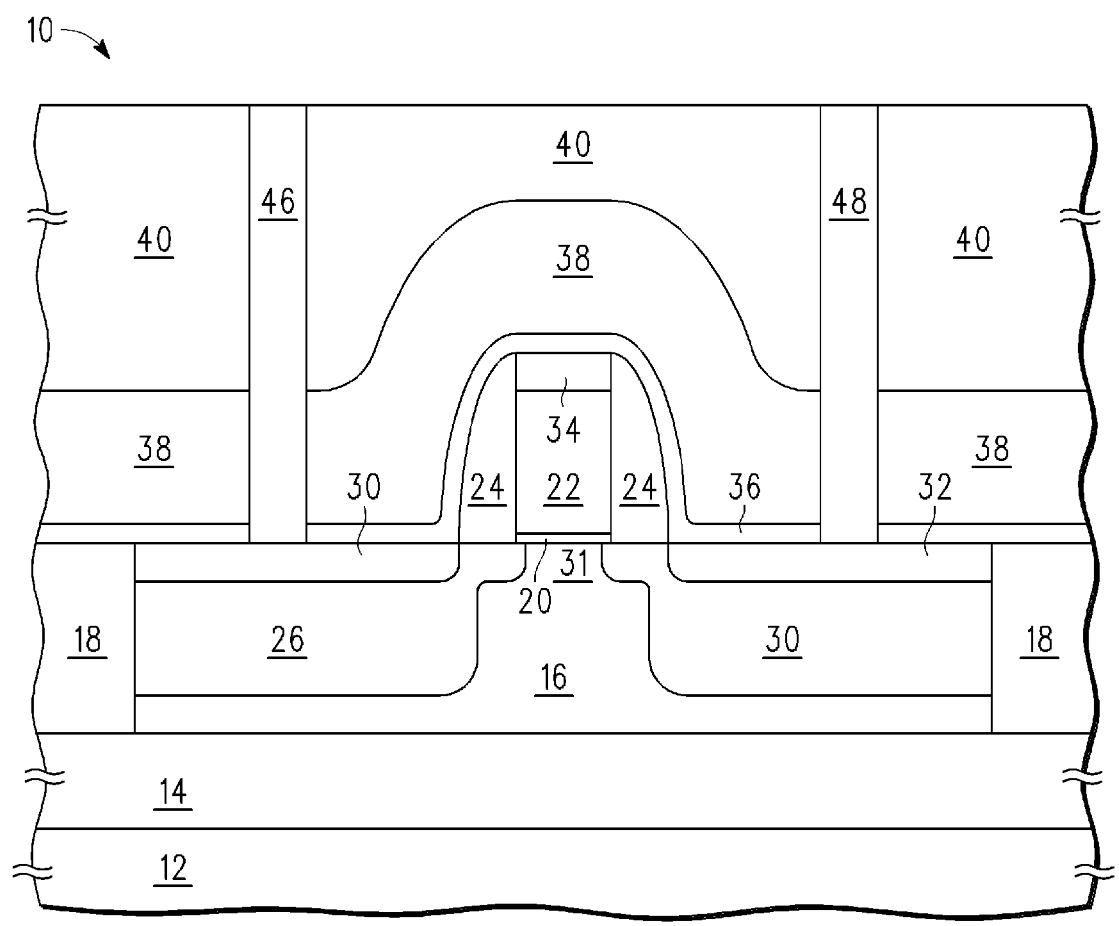
FIG. 6 is a cross section of the semiconductor device of FIG. 5 at a subsequent stage in processing.

Shown in FIG. 6 is semiconductor device 10 after filling openings 46 and 48 with conductive material. This preferably includes a barrier seed of titanium followed by titanium nitride (TiN) barrier. This is followed by filling openings 46 and 48 with tungsten. This is then followed by a planarizing step which may chemical mechanical polishing (CMP). After the tungsten has filled openings 46 and 48, an anneal is performed. Subsequent metallization steps are performed using copper. The effect is that this tungsten anneal is of a higher temperature than any subsequent step in the process. The tungsten anneal, which may be 450 degrees Celsius, is an event that causes hydrogen to mobilize and potentially migrate to channel 31. Barrier layer 36 is for preventing that migration to channel 31.

The formation of isolation region 18 would generally include nitride and oxide depositions and subsequent patterning of those layers. These may be processes that include a plasma that contains hydrogen. A pre-gate barrier layer such as barrier layer 36 could be deposited prior to forming the oxide and nitride layers used in defining isolation region 18 to retard hydrogen from reaching channel region 31. This would subsequently involve removing the pre-gate barrier layer prior to gate and gate dielectric formation so the pre-gate barrier layer would be sacrificial. Removal of the pre-gate barrier layer could be achieved by a hydrogen-free-plasma process such as the one described earlier.

Also formation of sidewall spacer 24 would typically involve plasma that contains hydrogen in both the deposition and the etch back of the nitride layer from which sidewall spacer 24 is formed. A liner oxide is typically formed over the gate. The oxide liner may either be replaced by or added to a post-gate barrier layer such as barrier layer 36 to provide a barrier between the nitride layer and subsequent sidewall spacer 24 and channel 31. The post-gate barrier layer would need to be removed over source/drains 26 and 30 during the formation of silicide regions 30 and 32. Thus the barrier layer could be in the location described for FIGS. 1-6, or as the liner, or as a sacrificial layer formed prior to gate formation. Further, more than one barrier layer may be formed; one as the pre-gate barrier, one as the liner, and one over the silicide regions as shown in FIGS. 1-6.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, an alternative would be to deposit the stressor layer as compressive and modify it over the N channel to the relaxed state or even the tensile state by an appropriate modification technique and leave it compressive over the P channel region. Another alternative is to deposit the stressor layer in a relaxed state and modify a portion of it to become compressive or tensile or even modify one portion to tensile and the other to compressive. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Thus in one view, there is a method of forming a semiconductor device includes steps of providing, forming, and performing. The step of providing provides a portion of a semiconductor device structure, the portion of the semiconductor device structure including a region susceptible to hydrogen incorporation due to subsequent device processing, the subsequent device processing including one or more of (i) forming a layer over the region, wherein the layer includes hydrogen and (ii) using gases containing hydrogen in a plasma for the subsequent device processing, wherein the semiconductor device is subject to an undesirable device characteristic alteration by hydrogen incorporation into the region. The step of forming forms a hydrogen barrier layer overlying the region, wherein the hydrogen barrier layer prevents substantial migration of hydrogen made available due to the subsequent device processing into the underlying region. The step of performing performs the subsequent device processing. The hydrogen barrier layer may comprise at least silicon, carbon, and nitrogen. The hydrogen barrier layer may further comprise hydrogen. Preventing substantial migration may comprise preventing on the order of at least ninety percent. The hydrogen barrier layer may comprise a layer having a thickness in the range from (i) not less than is required for forming a continuous layer and (ii) approximately 1000 Angstroms. The hydrogen barrier layer may comprise a thickness on the order of between 70 Angstroms and 1000 Angstroms. The hydrogen barrier layer may comprise a thickness on the order of 150 Angstroms. The region may comprise a device channel region. The portion of the semiconductor device structure may include at least one of (i) a gate structure and (ii) source and drain regions. The hydrogen barrier layer may be adapted to provide stable hydrogen barrier properties for a range of temperatures for the subsequent device processing, wherein the range of temperatures for the subsequent device processing includes temperatures that are higher than a formation temperature of the hydrogen barrier layer. The subsequent device processing may include etching the hydrogen barrier layer using a non-hydrogen plasma, followed by one of a wet HF etch or a vapor HF etch. The subsequent device processing may include front-end-of-line semiconductor device processing. The subsequent device processing may include back-end-of-line semiconductor device processing. The undesirable device characteristic alteration by hydrogen incorporation into the region may include at least one selected from the group consisting of a performance characteristic and a reliability characteristic.

In another view, a method for forming a semiconductor device has steps of providing, forming, and performing described differently. The step of providing provides a portion of a semiconductor device structure, the portion of the semiconductor device structure including a region susceptible to hydrogen incorporation due to subsequent device processing, the subsequent device processing including one or more of (i) forming a layer over the region, wherein the layer includes hydrogen and (ii) using gases containing hydrogen in a plasma for the subsequent device processing, wherein the semiconductor device is subject to an undesirable device characteristic alteration by hydrogen incorporation into the region. The step of forming forms a hydrogen barrier layer overlying the region, wherein the hydrogen barrier layer is adapted to prevent substantial migration of hydrogen made available due to the subsequent device processing into the underlying region, wherein the hydrogen barrier layer comprises at least silicon, carbon, nitrogen, and hydrogen, and wherein preventing substantial migration comprises preventing on the order of at least ninety percent. The step of performing performs the subsequent device processing. The hydrogen barrier layer may comprise a layer having a thickness in the range from (i) not less than is required for forming a continuous layer and (ii) approximately 1000 Angstroms. The region may comprise a device channel region, and wherein the portion of the semiconductor device structure includes at least one of (i) a gate structure and (ii) source and drain regions. The the subsequent device processing may include at least one of (i) front-end-of-line semiconductor device processing and (ii) back-end-of-line semiconductor device processing.

In yet another view, a semiconductor device has a portion of a semiconductor device structure and a hydrogen barrier layer overlying the region. The portion of the semiconductor device structure including a region susceptible to hydrogen incorporation due device processing, the device processing having included one or more of (i) forming a layer over the region, wherein the layer includes hydrogen and (ii) using gases containing hydrogen in a plasma for the device processing. The hydrogen barrier layer comprises at least silicon, carbon, nitrogen, and hydrogen, the hydrogen barrier layer having been adapted to prevent substantial migration of hydrogen made available due to the device processing into the underlying region, wherein substantial migration comprises on the order of at least ninety percent. The hydrogen barrier layer may comprise a thickness on the order of between 70 Angstroms and 1000 Angstroms.

What is claimed is:

1. A method of forming a semiconductor device comprising:

providing a portion of a semiconductor device structure, the portion of the semiconductor device structure including a region susceptible to hydrogen incorporation due to subsequent device processing, the subsequent device processing including one or more of (i) forming a layer over the region, wherein the layer includes hydrogen and (ii) using gases containing hydrogen in a plasma for the subsequent device processing, wherein the semiconductor device is subject to an undesirable device characteristic alteration by hydrogen incorporation into the region;

forming a hydrogen barrier layer overlying the region by plasma enhanced chemical vapor deposition using trimethylsilane and ammonia, wherein the hydrogen barrier layer prevents substantial migration of hydrogen that is made available due to the subsequent device processing into the region; and performing the subsequent device processing.

2. The method of claim 1, wherein preventing substantial migration comprises preventing at least ninety percent.

3. The method of claim 1, wherein the hydrogen barrier layer comprises a layer having a thickness in a range from (i) not less than is required for forming a continuous layer and (ii) approximately 1000 Angstroms.

4. The method of claim 1, wherein the region comprises a device channel region.

5. The method of claim 1, wherein the portion of the semiconductor device structure includes at least one of (i) a gate structure and (ii) source and drain regions.

6. The method of claim 1, wherein the hydrogen barrier layer is adapted to provide stable hydrogen barrier properties for a range of temperatures for the subsequent device processing, wherein the range of temperatures for the subsequent device processing includes temperatures that are higher than a formation temperature of the hydrogen barrier layer.

7. The method of claim 1, wherein the subsequent device processing includes etching the hydrogen barrier layer using a non-hydrogen plasma, followed by one of a wet HF etch or a vapor HF etch.

8. The method of claim 1, wherein the subsequent device processing includes front-end-of-line semiconductor device processing.

9. The method of claim 1, wherein the subsequent device processing includes back-end-of-line semiconductor device processing.

10. The method of claim 1, wherein the undesirable device characteristic alteration by hydrogen incorporation into the region includes at least one selected from the group consisting of a performance characteristic and a reliability characteristic.

11. The method of claim 1, wherein the hydrogen barrier layer comprises a thickness between 70 Angstroms and 1000 Angstroms.

12. The method of claim 11, further wherein the hydrogen barrier layer comprises a thickness of about 150 Angstroms.

13. A method of forming a semiconductor device comprising:

providing a portion of a semiconductor device structure, the portion of the semiconductor device structure including a region susceptible to hydrogen incorporation due to subsequent device processing, the subsequent device processing including one or more of (i) forming a layer over the region, wherein the layer includes hydrogen and (ii) using gases containing hydrogen in a plasma for the subsequent device processing, wherein the semiconductor device is subject to an undesirable device characteristic alteration by hydrogen incorporation into the region;

forming a hydrogen barrier layer overlying the region, by plasma enhanced chemical vapor deposition using trimethylsilane and ammonia, wherein the hydrogen barrier layer is adapted to prevent substantial migration of hydrogen made available due to the subsequent device processing into the region, wherein the hydrogen barrier layer comprises at least silicon, carbon, nitrogen, and hydrogen, and wherein preventing substantial migration comprises preventing on the order of at least ninety percent; and performing the subsequent device processing.

14. The method of claim 13, wherein the hydrogen barrier layer comprises a layer having a thickness in a range from (i) not less than is required for forming a continuous layer and (ii) approximately 1000 Angstroms.

15. The method of claim 13, wherein the region comprises a device channel region, and wherein the portion of the semiconductor device structure includes at least one of (i) a gate structure and (ii) source and drain regions.

16. The method of claim 13, wherein the subsequent device processing includes at least one of (i) front-end-of-line semiconductor device processing and (ii) back-end-of-line semiconductor device processing.

* * * * *